United States Patent

Ghamaty et al.

[11] Patent Number: 6,096,965
[45] Date of Patent: *Aug. 1, 2000

[54] QUANTUM WELL THERMOELECTRIC MATERIAL ON ORGANIC SUBSTRATE

[75] Inventors: Saeid Ghamaty; Norbert B. Elsner, both of La Jolla, Calif.

[73] Assignee: Hi-Z Technology, Inc., San Diego, Calif.

[*] Notice: This patent is subject to a terminal disclaimer.

[21] Appl. No.: 09/192,098

[22] Filed: Nov. 13, 1998

[51] Int. Cl.⁷ .................................................. H01L 35/00

[52] U.S. Cl. ..................... 136/201; 136/203; 136/205; 136/239; 62/62.3 T; 257/14

[58] Field of Search ..................................... 136/201, 203, 136/205, 239; 257/14, 15; 62/62.3 T

[56] References Cited

U.S. PATENT DOCUMENTS

| 5,436,467 | 7/1995 | Elsner et al. | 136/203 |
| 5,550,387 | 8/1996 | Elsner et al. | 136/203 |

Primary Examiner—Kathryn Gorgos
Assistant Examiner—Thomas H Parsons
Attorney, Agent, or Firm—John R. Ross; John R. Ross, III

[57] ABSTRACT

Thermoelectric elements for use in a thermoelectric device. The thermoelectric elements have a very large number of alternating layers of semiconductor material deposited on a very thin organic substrate. The layers of semiconductor material alternate between barrier semiconductor material and conducting semiconductor material creating quantum wells within the thin layers of conducting semiconductor material. The conducting semiconductor material is doped to create conducting properties. The substrate preferably should be very thin, a very good thermal and electrical insulator with good thermal stability and strong and flexible.

21 Claims, 5 Drawing Sheets

QUANTUM WELL THERMOELECTRIC MATERIAL ON ORGANIC SUBSTRATE

BACKGROUND OF THE INVENTION

1. Field of the Invention

This invention relates to thermoelectric devices and in particular to thermoelectric materials for such devices.

2. Description of the Related Art

Thermoelectric devices for cooling and heating and the generation of electricity have been known for many years; however, their use has not been cost competitive except for limited applications.

A good thermoelectric material is measured by its "figure of merit" or Z, defined as $$Z = S^2/\rho K$$

where S is the Seebeck coefficient, $\rho$ is the electrical resistivity, and K is the thermal conductivity. The Seebeck coefficient is further defined as the ratio of the open-circuit voltage to the temperature difference between the hot and cold junctions of a circuit exhibiting the Seebeck effect, or $$S = V/(T_h - T_c).$$

Therefore, in searching for a good thermoelectric material, we look for materials with large values of S and low values of $\rho$ and K.

Thermoelectric materials currently in use today include the materials listed below with their figures of merit shown:

| Thermoelectric Material | Peak Zeta, Z (at temperature shown) | ZT |
|---|---|---|
| Lead Telluride | $1.8 \times 10^{-3}/°$ K. at 500° K. | 0.9 |
| Bismuth Telluride | $3.2 \times 10^{-3}/°$ K. at 300° K. | 1.0 |
| Silicon germanium | $0.8 \times 10^{-3}/°$ K. at 1100° K. | 0.9 |

Workers in the thermoelectric field have been attempting to improve the figure of merit for the past 20–30 years with not much success. Most of the effort has been directed to reducing the lattice thermal conductivity (K) without adversely affecting the electric conductivity.

Applicants have been issued two United States Patents (U.S. Pat. Nos. 5,436,467 and 5,550,387), which are incorporated by reference herein. In those patents, Applicants disclosed a thermoelectric element having a very large number of very thin alternating layers of semiconductor material having the same crystalline structure. In a preferred embodiment, superlattice layers of SiGe with Si as barrier layers demonstrated figures of merit of more than six times better than bulk SiGe. These superlattice layers were grown on a Si substrate using a sputtering technique in an argon atmosphere.

Kapton® is a trademark of Dupont Corp. and is used to describe a well-known polyimide material. Films made of this material are also extensively used.

While the thermoelectric elements described in the above two patents represented a major advancement in thermoelectric technology. The prior art technology required for efficient use, the removal of the substrate on which the thin layers were laid down.

What is needed are better methods of preparing superlattice thermoelectric materials, elements and devices which do not require substrate removal.

SUMMARY OF THE INVENTION

The present invention provides thermoelectric elements for use in a thermoelectric device. The thermoelectric elements have a very large number of alternating layers of semiconductor material deposited on a very thin organic substrate. The layers of semiconductor material alternate between barrier semiconductor material and conducting semiconductor material creating quantum wells within the thin layers of conducting semiconductor material. The conducting semiconductor material is doped to create conducting properties. The substrate preferably should be very thin, a very good thermal and electrical insulator with good thermal stability, strong and flexible.

In a preferred embodiment, the thin organic substrate is a polyimide (specifically Kapton®) coated with an even thinner film of crystalline silicon. The substrate is about 0.3 mills (127 microns) thick. The crystalline silicon layer is about 0.1 micron thick. This embodiment includes on each side of the thin Kapton® substrate about 3,000 alternating layers of silicon and silicon-germanium, each layer being about 100 Å and the total thickness of the layers being about 30 microns. Preferably, the silicon layer is applied in an amorphous form and heated to about 350° C. to 375° C. to crystallize it.

DETAILED DESCRIPTION OF PREFERRED EMBODIMENTS

Figure 1:
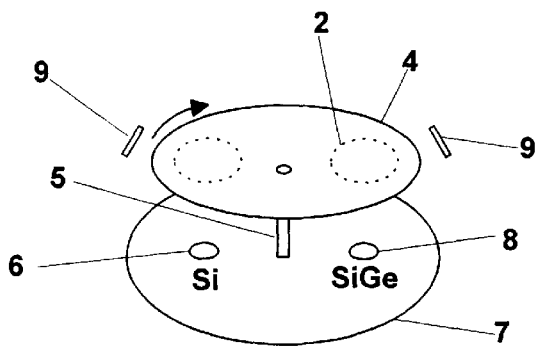
FIG. 1 is a simple drawing showing an apparatus for making superlattice materials.

Preferred embodiments of the present invention can be described by reference to the drawings.

Substrates for Quantum Well Thermoelectric Material

As described in U.S. Pat. Nos. 5,436,467 and 5,550,387, quantum well thermoelectric material is deposited in layers on substrates. For a typical substrate as described in those patents, heat loss through the substrate can greatly reduce the efficiency of a thermoelectric device made from the material. If the substrate is removed some of the thermoelectric layers could be damaged and even if not damaged the process of removal of the substrate could significantly increase the cost of fabrication of the devices. The present invention provides a substrate that can be retained. The substrate preferably should be very thin, a very good thermal and electrical insulator with good thermal stability and strong and flexible.

Kapton®

Kapton is a product of DuPont Corporation. According to DuPont bulletins:

Kapton® polyimide film possesses a unique combination of properties that make it ideal for a variety of applications in many different industries. The ability of Kapton® to maintain its excellent physical, electrical, and mechanical properties over a wide temperature range has opened new design and application areas to plastic films.

Kapton®) is synthesized by polymerizing an aromatic dianhydride and an aromatic diamine. It has excellent chemical resistance; there are no known organic solvents for the film. Kapton® does not melt or burn as it has the highest UL-94 flammability rating: V-0. The outstanding properties of Kapton® permit it to be used at both high and low temperature extremes where other organic polymeric materials would not be functional.

Adhesives are available for bonding Kapton® to itself and to metals, various paper types, and other films.

Kapton(® polyimide film can be used in a variety of electrical and electronic insulation applications: wire and cable tapes, formed coil insulation, substrates for flexible printed circuits, motor slot liners, magnet wired insulation, transformer and capacitor insulation, magnetic and pressure-sensitive tapes, and tubing. Many of these applications are based on the excellent balance of electrical, thermal, mechanical, physical, and chemical properties of Kapton® over a wide range of temperatures. It is this combination of useful properties at temperature extremes that makes Kapton® a unique industrial material.

Kapton® Substrate

Applicants have demonstrated that superlattice layers $Si_8Ge_2/Si$ can be deposited on very thin Kapton®. Applicants have discovered that thermoelectric material on these thin flexible substrates provides some important advantages for the design of thermoelectric elements and devices.

Thin Films on Kapton®

Alternating layers of $Si_{0.8}Ge_{0.2}$ and Si were grown on Kapton® substrates by deposition from two targets in a magnetron sputtering system. The plasma from the Si and $Si_{0.8}Ge_{0.2}$ target sources were separated, sensed and controlled to yield a total deposition rate of 100 Å/min. Prior to deposition, Kapton(® substrates were cleaned, then a 1000 Å thick silicon layer was applied to the Kapton® substrates. The silicon layer was sputtered in situ and annealed at 350° C.–375° C. to crystallize the silicon. Annealing and growth temperatures were measured directly by thermocouples. Then the Si and $Si_{0.8}Ge_{0.2}$ layers were alternatively deposited on the initial crystalline Si layer to make $Si_{0.8}Ge_{0.2}/Si$ superlattices with each layer being about 100 Å thick.

The actual deposition configuration is illustrated schematically in FIG. 1. Two Kapton® substrates 2 are mounted on the bottom of platen 4 that rotates at a rate of 1 revolution per minute. The platen is 20 cm in diameter and the substrates are each 5 cm in diameter. Two deposition sources 6 and 8 are mounted on a source flange 7 such that their deposition charges are about 10 cm from the axis 5. Deposition source 6 is pure silicon and deposition source 8 is silicon germanium doped to $\sim 10^{19}$ carriers per cc. For p-type material we use boron for the dopant and for n-type material we use antimony for the dopant. (Phosphorous could also be used as dopant.) The rotating platen is positioned 20 cm above the sources. We alternate the plasma so layers of silicon only and silicon and germanium are deposited.

Figure 8:
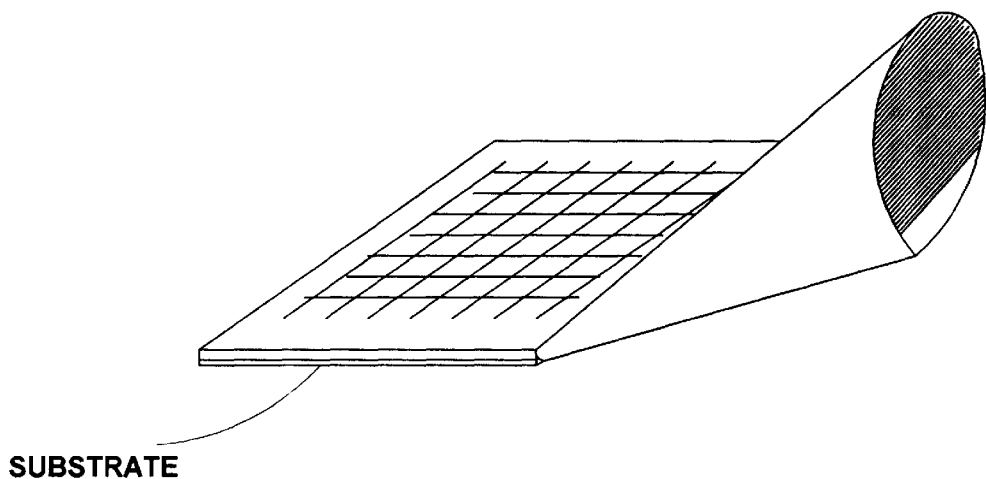
FIG. 8 shows the pattern from which thermoelectric elements are cut from the substrate on which they are grown and also shows a detailed enlarged view of the alternating layers.

The apparatus could be computer controlled to evaporate the sources alternatively at intervals appropriate to achieve the desired thickness while the platen rotates above. Two electroluminescent deposition meters 9 at the side of platen 4 could monitor layer thickness. Layers will continue to build on the substrates until we have a wafer with about 300,000 layers and a thickness of about 0.3 cm, which is the thickness needed for a preferred thermoelectric device. (The Kapton® substrate is 0.5 mills or 0.0127 cm thick. The wafer is then diced into chips as indicated in FIG. 8.

Test Results

The inventors have tested materials produced in accordance with the teachings of this invention. The tested thermoelectric properties of both n-type and p-type samples of $Si_{0.8}Ge_{0.2}/Si$ are compared in Table 1 with the properties of bulk material with the same ratios of Si and Ge.

The data reported in Table 1 was obtained with thin samples of about 500 alternating layers, each about 100 Å thick (for a total layer thickness of about 0.0005 cm) deposited on a 1 mill (0.00254 cm) Kapton® substrate coated with a 1000 Å (0.00001 cm) silicon layer. All measured values didn't need any correction for the insulating Kapton®. These Z values (in the range of $3\times10^{-4}$ to $5\times10^{-3}$) are amazingly high, approximately an order of magnitude higher than $Si_{0.8}Ge_{0.2}$. These results are also amazing in view of a prediction in 1991 that the maximum possible Z for bulk SiGe was about $1.7\times10^{-3}$/K for p-type elements and about $1.9\times10^{-3}$/K for n-type elements. (See Slack and Hussain, "The maximum possible conversion efficiency of silicon germanium thermoelectric generators", J. Appl. Phys. 70-5, 1 Sep. 1991.)

TABLE 1

| Sample $Si_{0.8}Ge_{0.2}/Si$ On Kapton ® | Type | Electrical Resistivity $\rho(m\Omega\text{-cm})$ | Seebeck Coefficient $\alpha(\mu V/° C.)$ | Power factor $(\alpha^2/\rho)/1000$ | Figure of Merit Z/(1/K) | ZT T = 300K |
|---|---|---|---|---|---|---|
| Sample 1N | N | 1.2 | −950 | 376 | $4.9 \times 10^{-3}$ | 1.47 |
| Sample 2N | N | 1.1 | −1050 | 501 | $6.5 \times 10^{-3}$ | 1.96 |
| Sample 3N | N | 1.4 | −1200 | 514 | $6.7 \times 10^{-3}$ | 2.01 |
| Bulk $Si_{0.8}Ge_{0.2}$ | N | 2 | −200 | 20 | $0.33 \times 10^{-3}$ | 0.1 |
| Sample 1P | P | 1.2 | +970 | 392 | $5.2 \times 10^{-3}$ | 1.56 |

TABLE 1-continued

Thermoelectric Properties at Room Temperature

| Sample $Si_{0.8}Ge_{0.2}/Si$ On Kapton ® | Type | Electrical Resistivity $\rho$(mΩ-cm) | Seebeck Coefficient $\alpha(\mu V/° C.)$ | Power factor $(\alpha^2/\rho)/1000$ | Figure of Merit Z/(1/K) | ZT T = 300K |
|---|---|---|---|---|---|---|
| Sample 2P | P | 1.3 | +1150 | 509 | $6.8 \times 10^{-3}$ | 2.03 |
| Sample 3P | P | 1.4 | +1250 | 558 | $7.4 \times 10^{-3}$ | 2.23 |
| Bulk $Si_{0.8}Ge_{0.2}$ | P | 1 | +130 | 17 | $0.3 \times 10^{-3}$ | 0.1 |

Typical samples comprised about 500 layers (250 each of Si and SiGe) for a total thickness of about 50,000 Å deposited on a Kapton® film. The samples were about 1 cm² so that the element dimensions were about 1cm×1cm× (0.00254cm+0.0005 cm+0.00001 cm) or about 1 cm×1 cm×0.003 cm. Both p-type and n-type thermoelectric elements were prepared and the thermoelectric properties were measured. The test results provided about 1 millivolt per °C. per 1 cm×1 cm×0.003 cm element. The test results indicated Z values in the range of about $3 \times 10^{-3}$/K to $5 \times 10^{-3}$/K, which are about 10 times larger than Z values for bulk $Si_{0.8}Ge_{0.2}$.

Intermediate Crystalline Layer

Applicants have shown that a crystal layer laid down between the Kapton substrate and the series of very thin conducting and barrier layers greatly improve thermoelectric performance especially for n-type layers. The preferred technique is to lay it on about 1000 Å thick in an amorphous form then to crystallize it by heating the substrate and the silicon layer to about 350° C. to 375° C. The crystalline layer could also be germanium or Group 3–5 compounds such as GaAs and GaP since these compounds have the same structures as silicon and germanium.

Substrates Other than Kapton®

Kapton® is an excellent film for the practice of this invention since it has extremely low thermal conductivity and is a very good insulator. It is also strong so the film thickness can be very thin. Suppliers other than DuPont make thin films of polyimide, and substrates of these other polymides could be used. Many other organic materials such as mylar, polyethylene and polyamide and polyimide compounds could be used as substrates. As stated above, the substrate preferably should be very thin, a very good thermal and electrical insulator with good thermal stability and strong and flexible.

Other Techniques for Making n-Type and p-Type Material

Sputtering equipment for making the n-type and p-type layered material is commercially available from several suppliers such as Kurt J. Lesker Co. with offices in Clairton, Pa.

Molecular beam epitaxy is done in a manner similar to the techniques used for the fabrication of X-ray optics. Vacuum is established and maintained by a two-stage mechanical roughing pump and a high-capacity cryogenic pump. The system usually achieves base pressures of approximately $10^{-10}$ torr after bake-out and before deposition. Substrates are mounted on a rotating carousel driven by a precision stepper motor.

Substrates can be heated or cooled by the carousel during sputtering. Heating of the substrate during deposition and subsequent annealing is used as a means of controlling the structure and orientation of individual crystalline layers, as well as means of reducing the number of defects in the films. (We can also control the temperature in order to enhance strain within the layers as a function of temperature as discussed later). On of the essential conditions for epitaxial film growth is a high mobility of condensed atoms and molecules on the surface of the substrate. Two 1 kW magnetrons, each having a 2–5 inch diameter target and a 1 kW power supply, are used to deposit films. The sputter sources are operated at an argon pressure between 0.001 and 0.1 torr. Argon is admitted to the system by a precision flow controller. All functions of the system, including movement of the carousel, rates of heating and cooling, magnetron power, and argon pressure, could be computer controlled.

Making Thermoelectric Elements with Thermoelectric Film

Figure 2A:
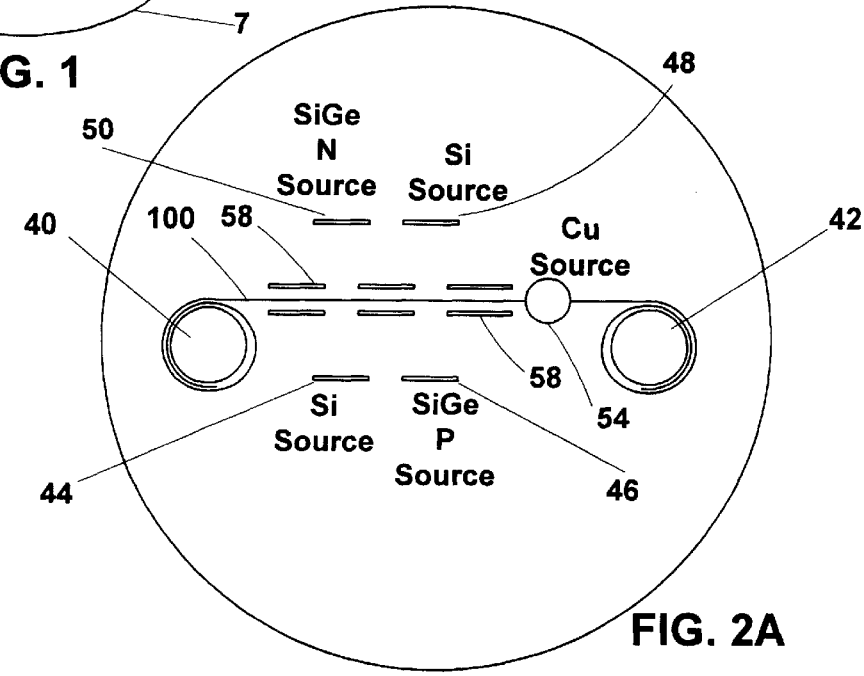
FIG. 2A is a top view of a preferred deposition chamber for fabricating thermoelectric film.
Figure 2B:
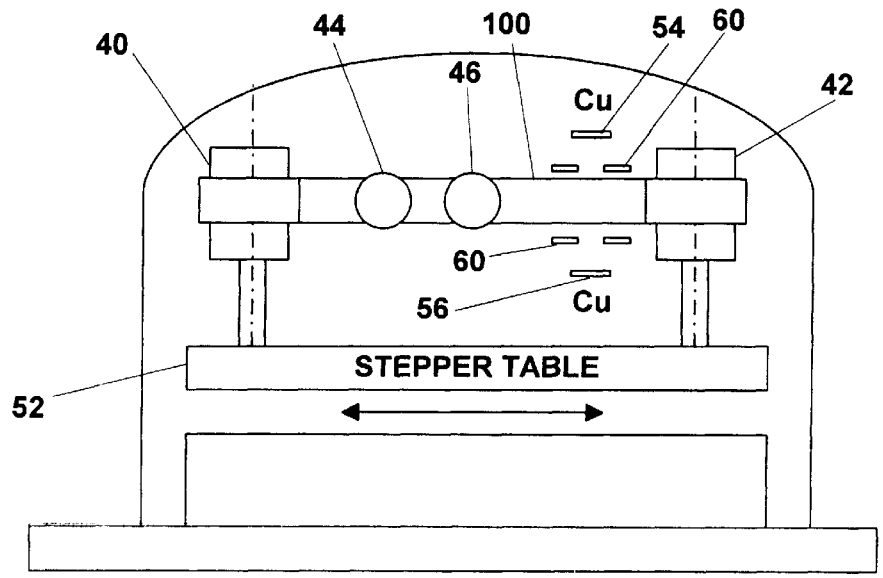
FIG. 2B is a side view of a preferred deposition chamber for fabricating thermoelectric film.

Preferred techniques for preparation of thermoelectric film can be explained by reference to FIGS. 2A and 2B through FIG. 7. FIG. 2A is a top view of a preferred deposition chamber for fabricating thermoelectric film. FIG. 2B is a side view sketch. A roll 40 of plain 0.5 mill thick Kapton® film coated on both sides with a 1000 Å thick layer of crystalline Si feeds take-up roll 42. Alternate layers (100 Å thick) of Si and SiGe (P doped) are deposited on one side of tape 100 from sources 44 and 46 and alternate layers of Si and SiGe (n-type) are deposited on the other side from sources 48 and 50. Stepper table 52 steps tape 100 back and forth so that 1500 layers of Si and 1500 layers of SiGe are deposited to form each thermoelectric element. After the 3000 layers are deposited on each side tape 100 is advanced toward take up roll 42 to permit a copper connection to be provided at the top and bottom of the top from copper targets 54 and 56. Marks 58 and 60 are provided to limit the deposition areas. The completed thermoelectric material includes the 0.5 mil substrate that results in bypass losses of about 5 to 10 percent. This slows the importance of choosing a substrate film as thin as feasible with good thermal and electrical insulating properties.

Figure 3:
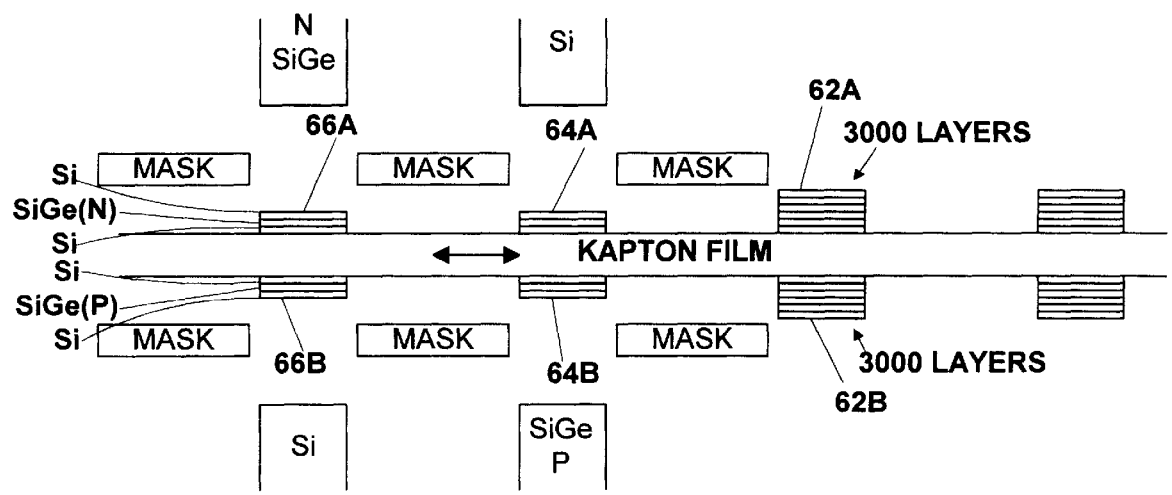
FIG. 3 shows an enlarged view of a section of Kapton® tape with alternating layers attached.

FIG. 3 shows an enlarged view of a section of tape. Elements 62A and 62B are completed and elements 64A, 64B, 66A and 66B are in the deposition process.

Figure 4A:
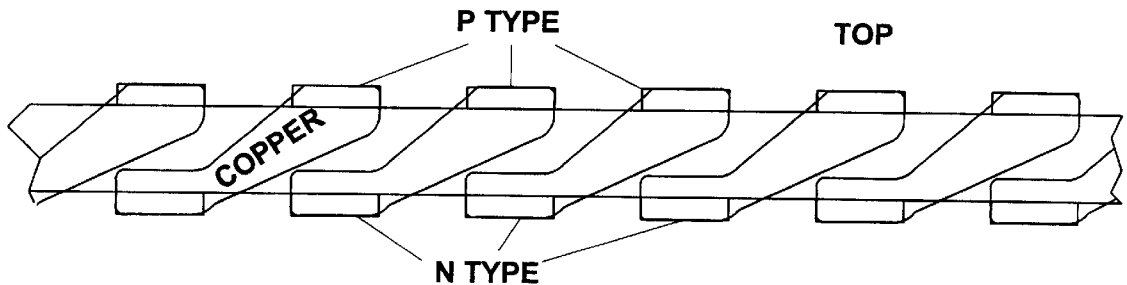
FIGS. 4A and 4B show the top and bottom views of how copper connections are made to put the elements in series.
Figure 4B:
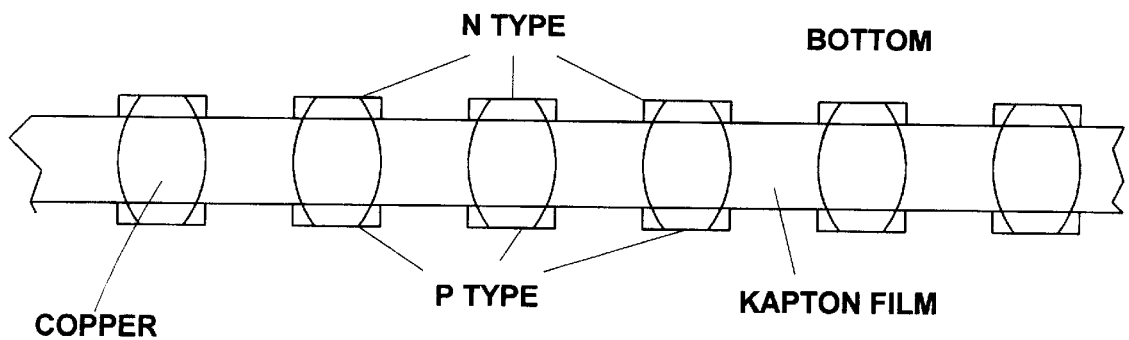

FIG. 4A is the top view of the tape showing how the top copper connections are made and FIG. 4B is a bottom view showing how the bottom copper connections are made to put the elements in series.

Figure 5A:
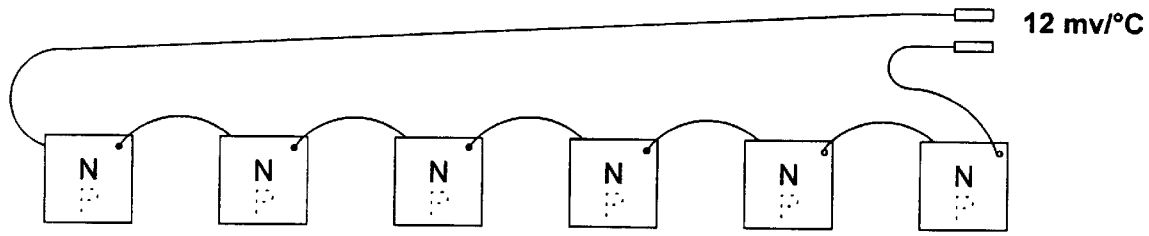
FIG. 5A shows how 12 elements could be connected in series to provide 12 mV/°C.
Figure 5B:
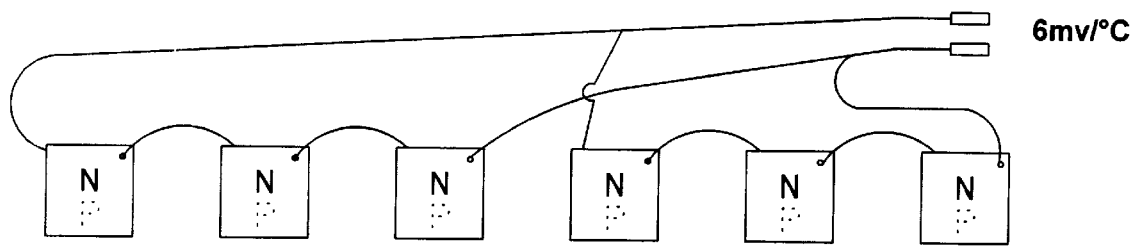
FIG. 5B shows how the 12 elements could be connected to provide 6 mV/°C. from the same 12 elements.

FIG. 5A shows how 12 elements could be connected in series to provide 12 mV/°C. FIG. 5B shows how the 12 elements could be connected to provide 6 mV/°C. from the same 12 elements.

Figure 6:
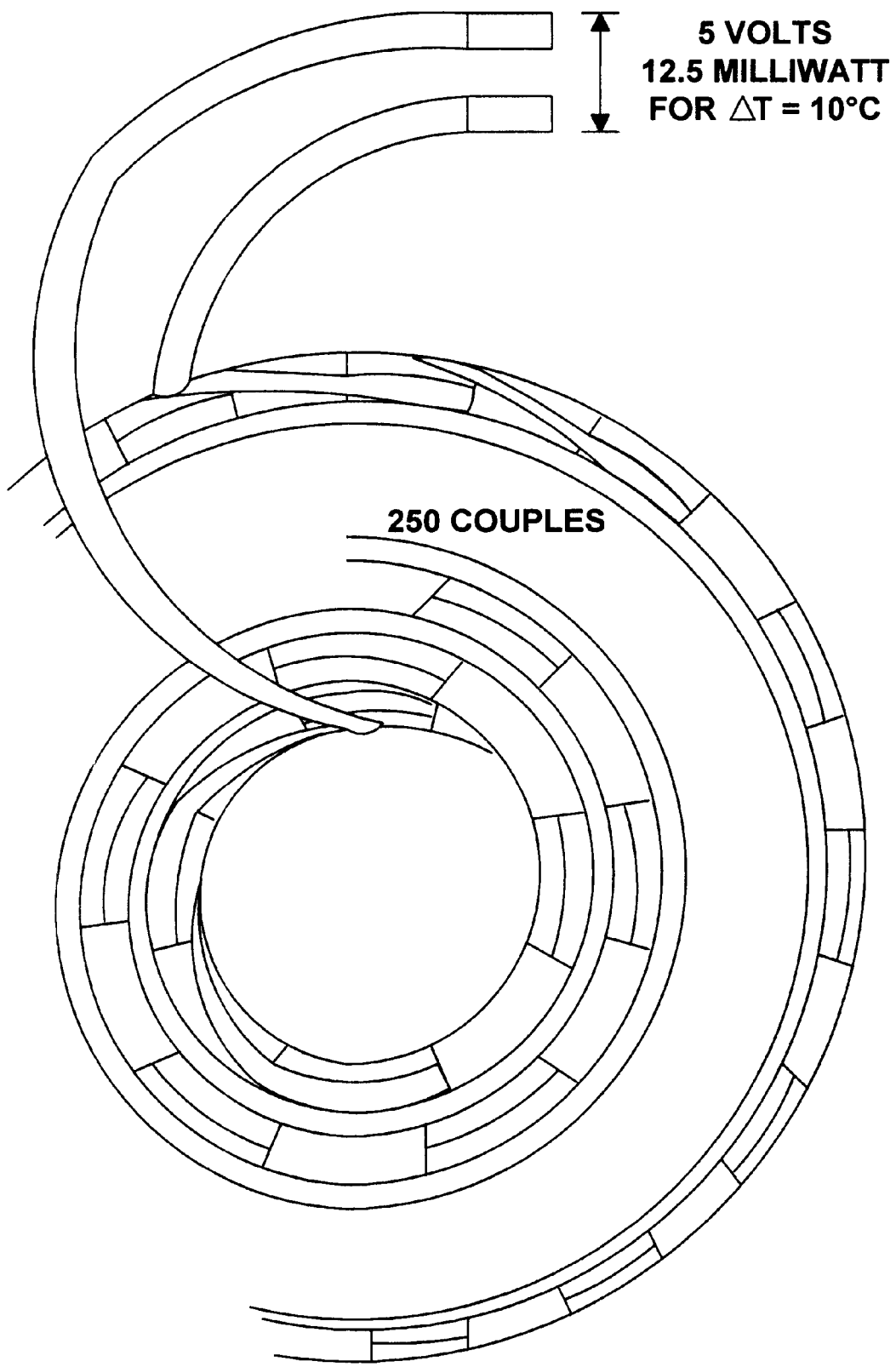
FIG. 6 shows an expanded view of a tape with 250 couples connected in series to produce a thermoelectric module for generating 12.5 milliwatts at a 5 volt potential from a 10° C. temperature difference.

FIG. 6 shows an expanded view of a tape with 250 couples connected in series to produce a thermoelectric module for generating 12.5 milliwatts at a 5 volt potential from a 10° C. temperature difference.

Figure 7:
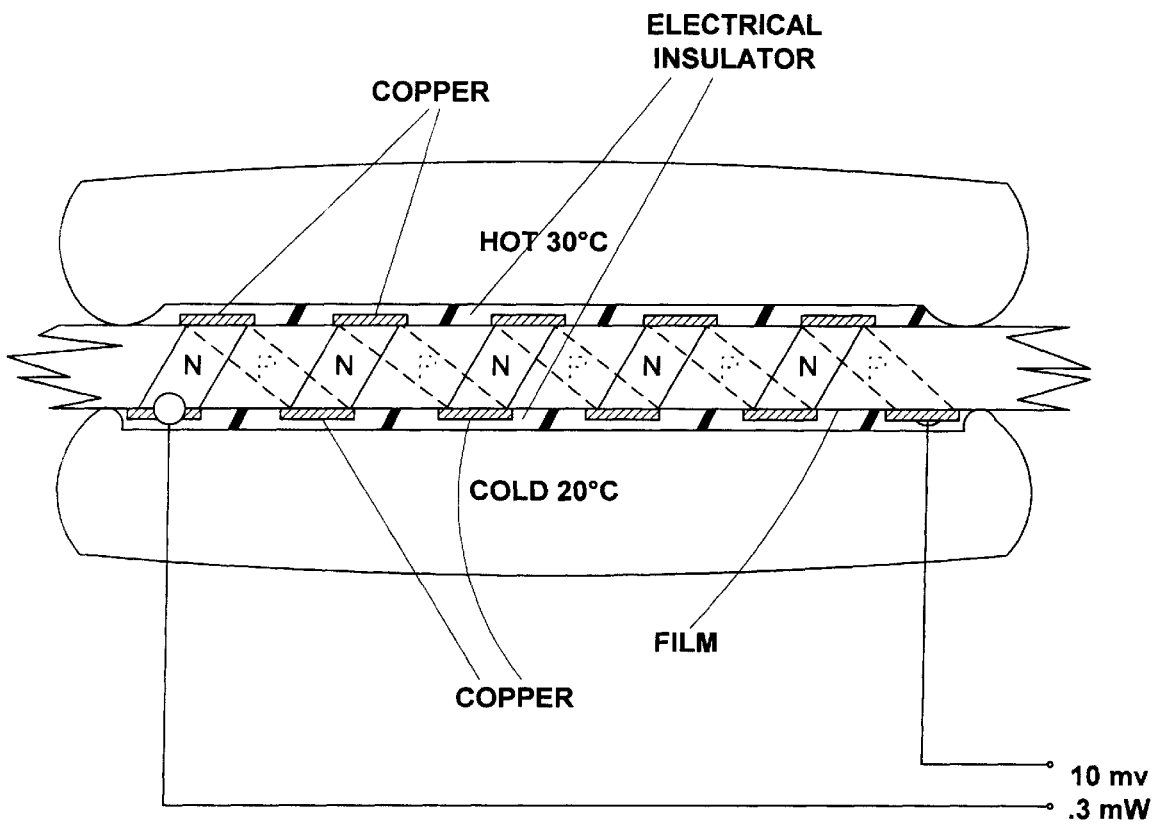
FIG. 7 shows another deposition technique that will permit the copper connections to be made more easily.

FIG. 7 shows another deposition technique that will permit the copper connections to be made more easily.

While the above description contains many specificities, the reader should not construe these as limitations on the scope of the invention, but merely as exemplifications of preferred embodiments thereof. For example, the SiGe ratio could be any composition between about 5 percent Ge to 100 percent Ge; however, the preferred composition is between about 10 percent Ge and about 40 percent Ge. The barrier layer need not be pure silicon. It could be a SiGe solid solution. The overall rational is that the band gap of the barrier layer should be higher than the conducting layer and these band gaps may be adjusted by altering the Si-Ge ratios in the respective layers. Those skilled in the art will envision many other possible variations within its scope. Persons skilled in thermoelectric art are aware of many different dopants other than the ones discussed above which would produce similar effects. Examples of n-type dopants include phosphorus and arsenic. Examples of p-type dopants in addition to boron are aluminum and antimony. Persons skilled in the are will recognize that it is possible to produce quantum layers having the same crystalline structures from materials having different crystal structures. For example, epitaxial layers of GeTe and PbTe could be fabricated even though PbTe and GeTe differ slightly in crystalline structure. Many film materials other than the ones identified could be used. Also, the principals of this invention could be used with an array of very small diameter threads, preferable of substrate materials identified such as Kapton®. Accordingly the reader is requested to determine the scope of the invention by the appended claims and their legal equivalents, and not by the examples which have been given.

We claim:

1. A quantum well thermoelectric element for use in a thermoelectric device comprised of:
    A) a substrate of electrically insulating organic material, and
    B) a plurality of very thin alternating layers deposited on said substrate, said layers comprising at least two different semiconductor materials, the first of said two materials, defining a barrier semiconductor material and the second of said two materials defining a conducting semiconductor material,
wherein said barrier semiconductor material and said conducting semiconductor material have similar crystalline structures, wherein said conducting semiconductor material is doped to create conducting properties, and wherein said layer arrangement of said at least two different materials creates quantum wells within said layers of said conducting semiconductor material.

2. A thermoelectric element as in claim 1, and further comprising a layer of crystalline silicon at least 1000 Å thick located between said substrate and said plurality of alternating layers.

3. A thermoelectric element as in claim 2, wherein said very thin alternating layers are each less than 1000 Å thick.

4. A thermoelectric element as in claim 1, wherein said very thin alternating layers are each about 100 Å thick.

5. A thermoelectric element as in claim 4, wherein said plurality of very thin alternating layers is at least 3000 layers.

6. A thermoelectric element as in claim 1, and further comprising a layer of germanium at least 1000 Å thick located between said substrate and said plurality of alternating layers.

7. A thermoelectric element as in claim 1, and further comprising a layer of silicon-germanium at least 1000 Å thick located between said substrate and said plurality of alternating layers.

8. A thermoelectric element as in claim 1, wherein said substrate is a polyimide substrate.

9. A thermoelectric element as in claim 1, wherein said barrier material is silicon and said conducting material is silicon-germanium.

10. A thermoelectric element as in claim 9, wherein the concentration of germanium in said conducting material is between 10 percent and 40 percent.

11. A thermoelectric element as in claim 9, wherein said conducting material is doped with a dopant.

12. A thermoelectric element as in claim 1, wherein said barrier material is silicon and said conducting material is germanium.

13. A thermoelectric element as in claim 1, wherein said crystalline structures are alpha rhombohedral.

14. A thermoelectric element as in claim 1, wherein at least one of said two different materials is an alloy of boron and carbon.

15. A thermoelectric material as in claim 1, wherein at least two of said at least two different materials are both alloys of boron and carbon.

16. A thermoelectric device comprising a plurality of quantum well thermoelectric elements, each such element comprised of:
    A) a substrate of electrically insulating organic material, and
    B) a plurality of very thin alternating layers deposited on said substrate, said layers comprising at least two different semiconductor materials, the first of said two materials, defining a barrier semiconductor material and the second of said two materials defining a conducting semiconductor material,
wherein said barrier semiconductor material and said conducting semiconductor material have similar crystalline structures, wherein said conducting semiconductor material is doped to create conducting properties, and wherein said layer arrangement of said at least two different materials creates quantum wells within said layers of said conducting semiconductor material.

17. A device as in claim 16 wherein said substrate is a polyimide.

18. A device as in claim 16 wherein said plurality of elements comprise at least one p-type element and at least one n-type element.

19. A method of making thermoelectric elements comprising the steps of depositing on a substrate of electrically insulating organic material, a plurality of very thin alternating layers of at least two different semiconductor materials, the first of said two materials, defining a barrier semiconductor material and the second of said two materials defining a conducting semiconductor material, wherein said barrier semiconductor material and said conducting semiconductor material have similar crystalline structures, wherein said conducting semiconductor material is doped to create conducting properties, and wherein said layer arrangement of said at least two different materials creates quantum wells within said layers of said conducting semiconductor material.

20. A method of making thermoelectric devices comprising the steps of:
    A) making a plurality of n-type and p-type thermoelectric elements by depositing on a substrate of electrically insulating organic material a plurality of very thin alternating layers of at least two different semiconductor materials, the first of said two materials, defining a barrier semiconductor material and the second of said two materials defining a conducting semiconductor material, wherein said barrier semiconductor material and said conducting semiconductor material have similar crystalline structures, wherein said conducting semiconductor material is doped to create conducting properties, and wherein said layer arrangement of said at least two different materials creates quantum wells within said layers of said conducting semiconductor material, and B) connecting said n-type and said elements to form said thermoelectric device.

21. A method as in claim 20 wherein said substrate is comprised of a polyimide.

* * * * *